United States Patent [19]

Raleigh

[11] Patent Number: 4,586,008
[45] Date of Patent: Apr. 29, 1986

[54] FAST PASSIVE COAXIAL INTEGRATOR

[76] Inventor: Michael Raleigh, 8491 Imperial Dr., Laurel, Md. 20708

[21] Appl. No.: 550,091

[22] Filed: Nov. 9, 1983

[51] Int. Cl.$^4$ .............................................. H03H 1/02
[52] U.S. Cl. ...................................... 333/19; 333/172
[58] Field of Search .................. 333/19, 20, 236, 245, 333/160, 172, 206; 328/127, 128, 78; 307/228, 490, 260, 555; 324/76 A

[56] References Cited

U.S. PATENT DOCUMENTS 3,239,751  3/1966  Sibary ............................ 333/172 X
3,723,912  3/1973  Thatch ................................. 333/20

OTHER PUBLICATIONS

Raleigh, M. and Pechacek, R. E., NRL Memorandum Report 4939, *A Fast Passive Integrator*, Sep. 30, 1982.

*Primary Examiner*—Eugene R. LaRoche
*Assistant Examiner*—Benny Lee
*Attorney, Agent, or Firm*—Stephen F. K. Yee

[57] ABSTRACT

A passive integrator capable of correctly providing outputs with risetimes as short as 250 ps. An outer conductor has coaxially mounted therein a short length of an inner conductor so as to constitute a very low impedance transmission line. The short length and low impedance of this transmission line cause it to behave as a capacitor. Electrostatically shielded resistors are connected to both ends thereof by a center conductor. Compensating capacitors coaxially mounted therewith may be employed.

18 Claims, 4 Drawing Figures

FAST PASSIVE COAXIAL INTEGRATOR

BACKGROUND OF THE INVENTION

This invention relates to a resistance-capacitance (RC) network, and more particularly to a fast passive integrator for providing accurate outputs for short risetimes.

Conventional passive RC networks are provided in circuits to integrate the input signal. While generally providing reliable results, such networks possess certain undesirable features, particularly when operating in conjunction with particle accelerators which produce fast risetime signals whose output current and voltage probes are intended to be displayed on oscilloscopes.

One problem is that the parasitic capacitance across the resistor causes the output to overshoot when given a fast rising input. Moreover, the integrating capacitor will display a self resonance because of its inductance. Additionally, a slow, high input impedance preamplifier is needed to avoid shortening the integrator decay time.

SUMMARY OF THE INVENTION

It is, therefore, an object of the present invention to provide a passive integrator for integrating fast risetime signals.

Another object of the present invention is to provide a passive integrator which compensates for all parasitic capacitances.

Yet another object of the present invention is to provide a passive integrator in which internal transit times are minimized such that resonances are too fast to be of consequence.

Still another object of the present invention is to provide a passive integrator resistively coupled to the preamplifier.

These and other objects of the present invention are achieved with an integrating capacitor formed by a short length of a very low impedance coaxial transmission line having coaxially-disposed inner and outer conductors separated by a dielectric material. A center conductor couples the integrating capacitor to resistors on each end thereof. Electrostatic shielding is provided about the resistors to compensate for parasitic capacitances inherent in the resistors. Compensating capacitors on each end of the resistors distal from the integrating capacitor may be included.

Other and further aspects of the present invention will become apparent from the following description of presently-preferred but illustrative embodiments and by reference to the accompanying drawings wherein like numerals represent like parts throughout the several views.

DESCRIPTION OF THE PREFERRED EMBODIMENTS

Figure 1:
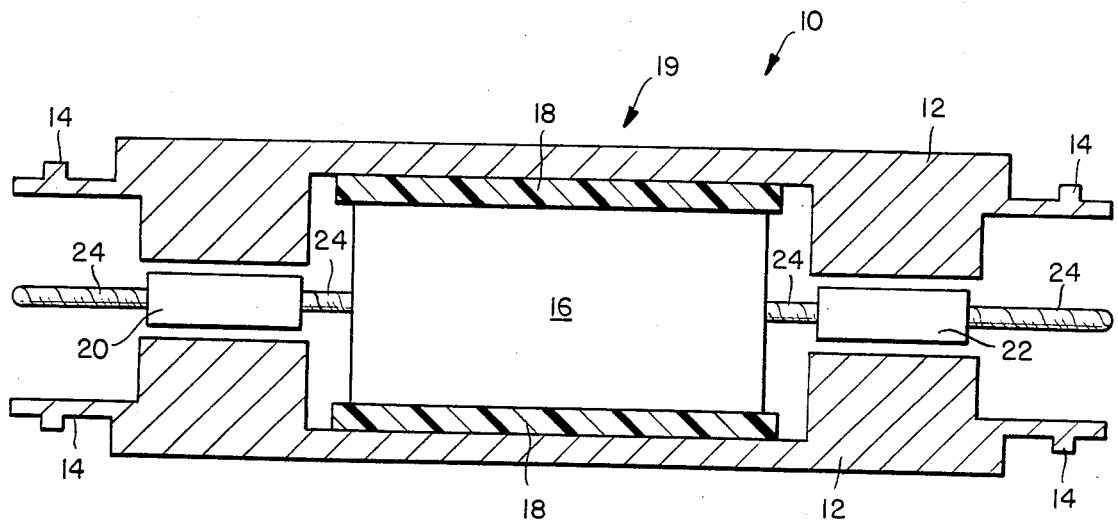
FIG. 1 is a schematic diagram, in section, of one embodiment of the passive integrator according to the invention.

Referring now to FIG. 1, passive integrator 10 is of coaxial construction having an outer conductor 12 with connector 14 at the ends thereof, such as a conventional BNC connector. A short length of an inner conductor 16 is mounted at the center thereof and insulated from conductor 12 by an insulator 18 of a frequency independent dielectric constant material, such as Mylar or polyethylene. Inner conductor 16, insulator 18 and outer conductor 12 together constitute a short length of a very low impedance coaxial transmission line which acts as a capacitor, and for the purposes of this description is defined as an integrating capacitor 19.

Resistors 20 and 22 are placed at opposing ends of inner conductor 16 and each exhibits a time-independent resistance which may be achieved in a resistor having a skin depth which is large in comparison to its cross-sectional dimension. A suitable resistor may comprise a molded composition resistor possessing low inductance and low parasitic capacitance, such as a 1 Kohm, ½ watt resistor available commercially from Allen-Bradley Company. A center conductor 24, coaxial with outer conductor 12, connects resistor 20 to inner conductor 16 and the inner conductor to resistor 22. Conductor 24 preferably comprises several segments of copper wire.

The inner diameter of outer conductor 12 is substantially reduced in the vicinity of resistors 20 and 22 so that it is very close fitting thereabout. Otherwise stated, outer conductor 12 is provided with an aperture at each end of inner conductor 16 in which resistors 20 and 22 are received, with "aperture" referring to the spacing between the outer surfaces of resistors 20 and 22 and the inner surface of the outer conductor 12 at the point of reduced diameter. The reduced diameter of the conductor 12 provides for electrostatic shielding between the ends of respective for resistors 20 and 22, respectively thereby reducing the effects of the inherent parasitic capacitance of the resistors, as well as providing shunt capacitance to ground.

While not intended to be limiting, the following dimensions are illustrative for the various elements of the integrator 10.

Figure 2:
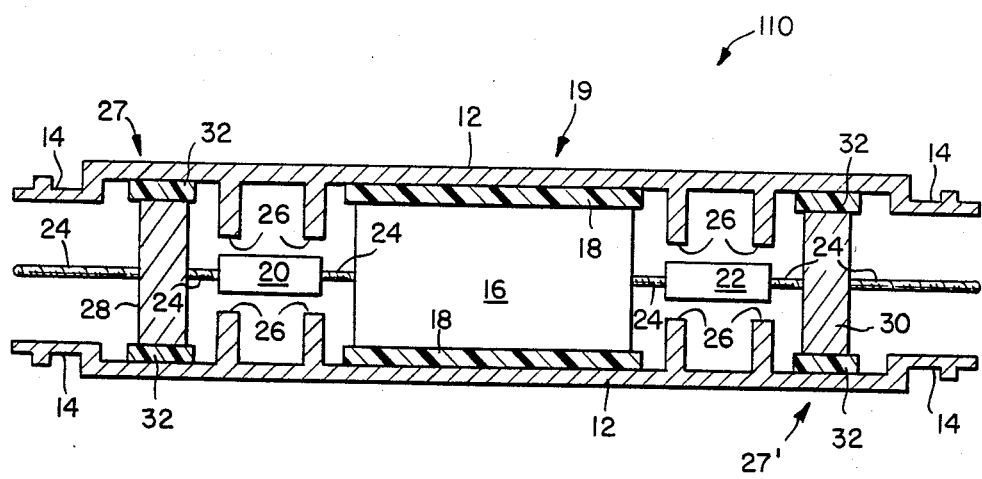
FIG. 2 is a schematic diagram, in section, of a second embodiment of the passive integrator according to the invention.

Length of the assembled integrator—4 inches
Outer conductor (12)
    outer diameter—1 inch
    inner diameter—0.752 inch
Inner conductor (16)
    diameter—0.75 inch
    length—0.75 inch
Resistors (20, 22) diameter—⅛ inch
Insulator (18) thickness—1 mil
Aperture diameter—0.166 inch Referring now to FIG. 2, there is illustrated a second embodiment of the passive integrator 110 employing compensating capacitors. As in FIG. 1, the outer conductor 12 has inner conductor 16 mounted therein, with resistors 20 and 22 on opposing ends thereof and coupled to the inner conductor by center conductor 24. In this embodiment, double apertures 26 are employed which are not as close fitting to resistors 20 and 22 as in the embodiment of FIG. 1, requiring the employment of compensating capacitors, such as capacitors 27 and 27' on the ends of resistors 20 and 22 not facing integrating capacitor 19.

Compensating capacitor 27 is constituted by inner conductor 28 coaxially disposed within outer conductor 12 and insulated therefrom by an insulator 32 which, as in FIG. 1, is of a frequency independent dielectric material, such as Mylar or polyethylene. Similarly, compensating capacitor 27' is constituted by inner conductor 30 coaxially disposed within outer conductor 12 and separated therefrom by insulator 32.

Figure 3:
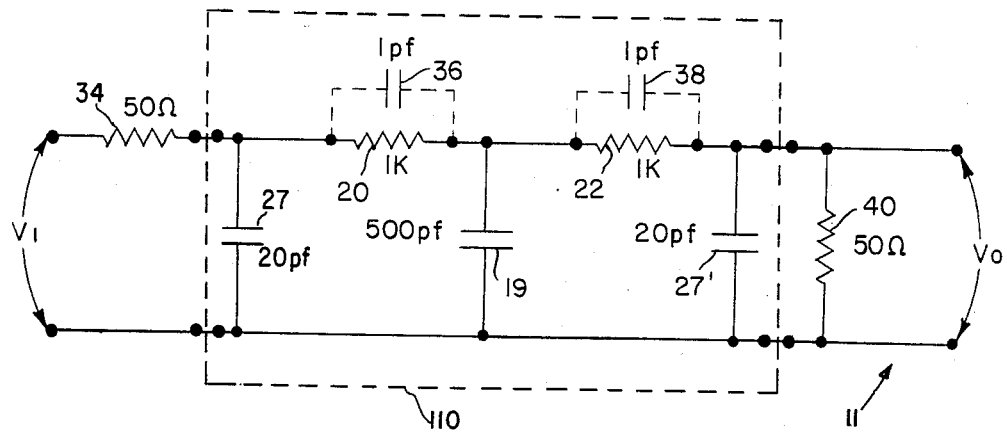
FIG. 3 is the equivalent electrical circuit of the passive integrator according to the invention.

Referring now to FIG. 3, there is shown the equivalent electrical circuit of the fast passive integrator according to the present invention. Resistor 34 represents the impedance of the input cable which typically is 50 ohms. Coupled between resistor 34 and ground is compensating capacitor 27. Resistors 20 and 22 are illustrated herein with their parasitic capacitances 36 and 38, respectively, thereacross. Resistor 22 resistively couples the integrator 10 to a preamplifier 11. Resistor 40, which is in parallel with compensating capacitor 27', represents the input impedance of the preamplifier 11. The preamplifier may be a Tektronix 7A29 model which, when used in conjunction with a Tektronix 7104 model oscilloscope, has a risetime of less than 380 ps.

The lengths and radii of integrating capacitor 19 and compensating capacitors 27 and 27' shown in FIG. 2 each must be short compared to the signal wavelength ($\lambda \geq 1$ inch) in order for the circuit representation of FIG. 3 to be correct.

The behavior of the fast passive integrator will be qualitatively described first. Resistor 34 and capacitor 27 constitute an RC integrator for fast incoming signals, i.e., signals having rise times (t) of less than one nanosecond. This occurs as follows. The voltage that appears on capacitor 27 is proportional to the charge that accumulates in it, with this charge being the integral of the current that flows through resistor 34. As long as the voltage on capacitor 27 is small compared to the input voltage (for rise times t<1 ns.) the current that flows in resistor 34 depends solely on the input voltage. Thus, the voltage on capacitor 27 is proportional to the integral of the input voltage. The subsequent circuit (capacitors 36, 19, 38, and 27) acts as a capacitive voltage divider causing the output voltage to be proportional to the voltage on capacitor 27, and thus proportional to the integral of the input voltage. This capacitive divider does not load, i.e., remove charge from, capacitor 27 because of the small size of capacitor 36.

For slow incoming signals, i.e., signals having rise times of greater than one nanosecond, capacitor 27 is always charged through resistor 34 such that the voltage on it approximates the input voltage. Likewise, capacitor 36 is always charged to the voltage determined by the current flow through resistor 20. Integration now occurs by the accumulation of charge in capacitor 19 because of the current flowing through resistor 20. Resistors 22 and 40 act as a resistive voltage divider, causing the output voltage to be proportional to the voltage on capacitor 19 and, thus, to the integral of the input voltage. The voltages on capacitors 38 and 27 are now controlled by resistors 22 and 40, respectively.

The time constants (time for a capacitor to charge or discharge through a resistor) for the resistor 34—capacitor 27, resistor 20—capacitor 36, resistor 22—capacitor 38, and resistor 40—capacitor 27 combinations are all equal (1 ns). Thus, the transition from the fast signal mode of integration to the slow signal mode of integration occurs simultaneously in all parts of the circuit. This equality of the time constants also represents the choice of component values for which the gain of the integrator is the same in the fast and slow modes. Gain may be defined as the output voltage divided by the integral of the input voltage. Thus, a signal with both fast and slow components is integrated correctly.

A quantitative analysis of the fast passive integrator now follows. A passive integrator is characterized by having a response to an impulse function, $\delta(t)$, which is a decaying step, $u(t)e^{-\alpha t}$, where these functions are defined by $$\int_{0^-}^{0^+} \delta(t)dt = 1$$

and, $$u(t) = \left\{ \begin{array}{l} 0 \text{ for } t < 0 \\ 1 \text{ for } t > 0 \end{array} \right\}$$

The fast passive integrator may thus be shown to function correctly by demonstrating that it has this type of response. By the use of Laplace transforms it may be shown that the impulse response of the circuit shown in FIG. 3 is $$V_o(t) = u(t)\{9 \times 10^{-5} e^{-3.8 \times 10^{-3} t} - 3.6 \times 10^{-7} e^{-t}\}$$

where time is in nanoseconds. The impulse response of this circuit is seen to be a step with an ~250 ns. decay (first term) and an infitesimal (~1/250 of the main signal) undershoot lasting one nanosecond (second term). Subject to the approximations represented by FIG. 3, the fast passive integrator thus behaves correctly.

Figure 4:
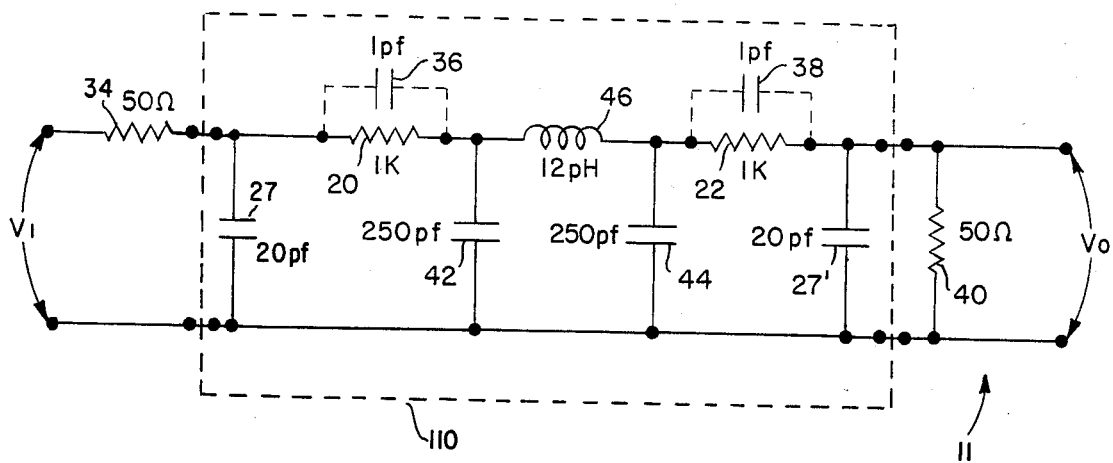
FIG. 4 shows a modification of the equivalent electrical circuit of FIG. 3.

Referring now to FIG. 4, the equivalent circuit of FIG. 3 is modified to incorporate the simplest representation of integrating capacitor 19 as a transmission line. This representation consists of two equal 250 pf capacitors 42, 44 joined by inductor 46 and resistor 41. Representation of the circuit as shown enables analysis of the effects of resonance within the integrating capacitor. This analysis was performed using a circuit analysis computer code. The output voltage in response to an impulse function was calculated and found to be the desired decaying step function with the exception of a finite rise time of ~250 ps. This represents almost an order of magnitude improvement over the prior art.

There has therefore been provided a passive integrator for correctly providing outputs having risetimes as short as 250 ps. The decay time of the integrator is approximately 250 ns. The integrator is not subject to overshoot and self resonances, and is capable of driving fast 50 ohm impedance preamplifiers. All parasitic capacitances are compensated, the resonance of the integrating capacitor is raised to a frequency where it cannot adversely affect performance, and the passive integrator is resistively coupled to a preamplifier.

It is to be understood that the above described embodiments are simply illustrative of the invention. Various other modifications and changes may be made by those skilled in the art which will employ the principles of the invention and fall within the spirit and scope thereof.

What is claimed is:

1. A fast passive integrator for integrating an input signal having a fast risetime, comprising:
    an outer conductor;

an inner conductor closely fitted coaxially in said outer conductor;

a first resistive element disposed at one end of said inner conductor and a second resistive element disposed at the other end of said inner conductor, said resistive elements being coaxial with said outer conductor; and a center conductor also coaxial with said outer conductor and electrically coupling said first resistive element to said inner conductor and said inner conductor to said second resistive element.

2. A fast passive integrator as recited in claim 1, further including a dielectric material placed between said outer conductor and said inner conductor.

3. A fast passive integrator as recited in claim 2, wherein said dielectric material comprises a frequency independent dielectric constant material.

4. A fast passive integrator as recited in claim 2, wherein said outer conductor has a reduced inner diameter in the area adjacent to each of said first and second resistive elements to form close fitting apertures thereabout so as to provide electrostatic shielding between the respective ends of each of said first and said second resistive elements and to provide a shunt capacitance between each of said first and said second resistive elements and said outer conductor.

5. A fast passive integrator as recited in claim 2, further including first and second compensating capacitors coupled to said first and second resistive elements, respectively, on the end of each resistive element not facing said inner conductor and coupled thereto with said center conductor.

6. A fast passive integrator as recited in claim 5, wherein each of said first and second compensating capacitors comprises a conductive element coaxial within and insulated from said outer conductor by a dielectric material.

7. A fast passive integrator as recited in claim 6, wherein said dielectric material comprises a frequency independent dielectric constant material.

8. A fast passive integrator as recited in claim 5, wherein said outer conductor has a reduced inner diameter in the area adjacent to each of said first and second resistive elements.

9. A fast passive integrator as recited in claim 2, wherein the inner dimensions of said integrator are small relative to the input signal wavelength, said wavelength being equal to or greater than one inch, whereby the input signals have minimal internal transit times.

10. A fast passive integrator as recited in claim 4, further including first and second compensating capacitors coupled to said first and second resistive elements, respectively, on the end of each resistive element not facing said inner conductor and coupled thereto with said center conductor.

11. A fast passive integrator as recited in claim 10, wherein each of said first and second compensating capacitors comprises a conductive element coaxial within and insulated from said outer conductor by a dielectric material.

12. A fast passive integrator for correctly producing an output for an input signal having a fast risetime, comprising:

an integrating capacitor comprising a short length of very low impedance coaxial transmission line;

first and second resistive elements disposed at each end of said integrating capacitor; and a center conductor coaxial with said integrating capacitor and electrically coupling said first and second resistive elements to said integrating capacitor.

13. A fast passive integrator as recited in claim 12, wherein said coaxial transmission line comprises:

an outer conductive element;

an inner conductive element coaxially disposed in said outer conductive element; and an insulator disposed between said inner and outer conductive elements, said insulator comprising a frequency independent dielectric constant material, said first and second resistive elements being coupled to said inner conductive element by said center conductor.

14. A fast passive integrator as recited in claim 13, wherein said outer conductive element has a reduced inner diameter in the area adjacent to each of said first and second resistive elements to form close fitting apertures thereabout to provide electrostatic shielding between the respective ends of each of said first and said second resistive elements and to provide a shunt capacitance between each of said first and said second resistive elements and said outer conductive element.

15. A fast passive integrator as recited in claim 14, wherein the inner dimensions of said integrating capacitor are small relative to the input signal wavelength, said wavelength being equal to or greater than one inch, whereby the input signals have minimal internal transit times.

16. A fast passive integrator as recited in claim 14, further including first and second compensating capacitors coupled to said first and second resistive elements, respectively, on the respective outer end not facing said integrating capacitor and coupled thereto with said center conductor.

17. A fast passive integrator as recited in claim 16, wherein each of said first and second compensating capacitors comprises a conductive element coaxial within and separated from said outer conductive element by a frequency independent dielectric constant material.

18. A fast passive integrator as recited in claim 17, wherein the inner dimensions of said integrating capacitor and said compensating capacitors are small relative to the input signal wavelength, said wavelength being equal to or greater than one inch, whereby the input signals have minimal internal transit times.

* * * * *